United States Patent [19]

Wu

[11] Patent Number: 4,929,595
[45] Date of Patent: May 29, 1990

[54] SUPERCONDUCTING THIN FILM FABRICATION

[75] Inventor: Maw-Kuen Wu, Huntsville, Ala.

[73] Assignee: The University of Alabama at Huntsville, Huntsville, Ala.

[21] Appl. No.: 161,012

[22] Filed: Feb. 26, 1988

[51] Int. Cl.$^5$ .................... H01L 39/12; H01L 39/24; C23C 14/34
[52] U.S. Cl. .................. 505/1; 204/192.24; 428/701; 428/930; 505/813; 505/816
[58] Field of Search ............... 204/192.24; 505/816, 505/819, 813; 428/930, 697, 701

[56] References Cited

PUBLICATIONS

W. N. Wang et al., *Jap. J. Appl. Phys.*, vol. 27, No. 7, Jul. 1988, pp. L1268–L1270.
K. Yoshihara et al., *Jap. J. Appl. Phys.*, vol. 27, No. 8, Aug. 1988, pp. L1492–L1494.
C. A. Chang et al., *Appl. Phys. Lett.*, vol. 52, No. 1, Jan. 1988, pp. 72–74.
H. Koinuma et al., *Jap. J. Appl. Phys.*, vol. 26, May 1987, pp. L763–L765.
H. Koinuma et al., *Jap. J. Appl. Phys.*, vol. 27, Jul. 1988, pp. L1216–L1218.
M. K. Wu et al., *Appl. Phys. Lett.*, vol. 52, May 1988, pp. 1915–1917.

*Primary Examiner*—Aaron Weisstuch
*Attorney, Agent, or Firm*—Oblon, Spivak, McClelland, Maier & Neustadt

[57] ABSTRACT

An improved fabrication of superconducting films is disclosed whereby a multi-phase Y-Ba-Cu-O compound is utilized. The film is formed by sputtering of a target material consisting of the superconducting 123 phase $Y_1Ba_2Cu_3O_7$ onto the green 211 phase $Y_2BaCuO_5$. After annealing, the superconducting characteristics, of the formed film, in terms of transition width and $T_c$, are improved over those using other oxide compounds as substrates.

3 Claims, 2 Drawing Sheets

SUPERCONDUCTING THIN FILM FABRICATION

BACKGROUND OF THE INVENTION

1. Field of the Invention:

The present invention concerns the fabrication of a superconducting thin film having improved superconductor characteristics.

2. Discussion of Background:

Since the first 90K multi-phase Y-Ba-Cu-O compound disclosed in co-pending application Ser. No. 014,354 filed Feb. 13, 1987 and in the article by Wu, et al., Physics Rev. Lett. 58, 908 (1987), the activity which has been addressed to the substitution of various ions including the $Y^{3+}$ ions by stable trivalent, rare earth ions with comparable radii or the substitution of the copper ions by transition metal ions has produced mixed results. On some occasion these substitutions have led to a lowering of $T_c$ or the complete disappearance of superconductivity.

Another area of activity revolves around application of the cuprate superconductors to thin film work.

It is this thin film fabrication which the present invention is specifically addressed to.

SUMMARY OF THE INVENTION

Accordingly, it is an object of the present invention to provide an improved fabrication technique for providing improved superconducting films which have superconducting characteristics with respect to higher transition temperatures and sharp transition characteristics.

It is the further object of the present invention to provide a superconducting thin film utilizing a radio frequency sputtering technique and a target material of the 123 superconducting phase of the Y-Ba-Cu-O compound with a substrate material utilizing the 211 semiconducting phase.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

During the process of making the first 90K multi-phase Y-Ba-Cu-O compound (co-pending application Ser. No. 914,359 filed Feb. 13, 1987 and in the article, Phys. Rev. Lett. 58, 908 (1987) it was observed that samples, when reacted at a higher temperature than 950° but with a comparatively shorter firing time gave sharper Tc transitions. The Y-Ba-Cu-O compound was composed of the green $Y_2BaCuO_5$ phase (the "211" phase) and the superconducting $Y_1Ba_2Cu_3O_7$ phase (the "123" phase). In order to obtain a single phase 123 compound, it was observed that an extremely careful heat treatment procedure was required. These observations provided the hypothesis that the presence of the 211 phase is thermo-dynamically favorable to the formation of the superconducting 123 phase and that the processing at higher temperatures may stabilize some otherwise unstable phases. Applicants' co-pending application Ser. No. 161,152, filed Feb. 26, 1988 is addressed to the high temperature treatment.

Based on the observation that the 211 phase is thermo-dynamically favorable to the formation of the superconducting 123 phase, a superconducting thin film was constructed in the following manner utilizing a superconducting phase as a thin film target material and a 211 phase semiconducting material as a substrate.

The compound used for the target material consisted of appropriate amounts of mixed together metal oxides to form the 123 phase $Y_1Ba_2Cu_3O_7$ which was pressed into pellets and heated at 950° C. for 12 hours and then quenched to room temperature.

Substrate material was prepared by grinding of appropriate amounts of oxide, pressing into pellets, and heating at 950° C. for 12 hours to form the 211 phase $Y_2BaCuO_5$. In order to insure complete reaction, the material was reground, pressed into pellets again and then reheated.

Fabrication of the thin films involve the use of the RF (radio frequency) sputtering technique wherein the target material (the 123 phase) was first annealed in oxygen at 950° C. for 6 hours and then slowly cooled in a furnace. The superconductivity onset temperature was approximately 96° K. The substrate material used was the 211 phase discussed above. The homogeneity of the 211 phase was determined using a Raman micro probe as per the method discussed in Loo et al. "High Temperature Superconducting Materials—Preparation, Properties and Processing", ed. W. E. Hatfield, 1988.

Although RF sputtering was used involving the simple application of an a.c. signal without any magnetron enhancement and simply using room temperature, any accepted technique of forming thin films would function to provide improved superconductor characteristics because of the use of the "211" phase as a substrate. Additional techniques include the use of magnetron enhanced RF sputtering, D.C. sputtering and laser evaporation.

Figure 1:
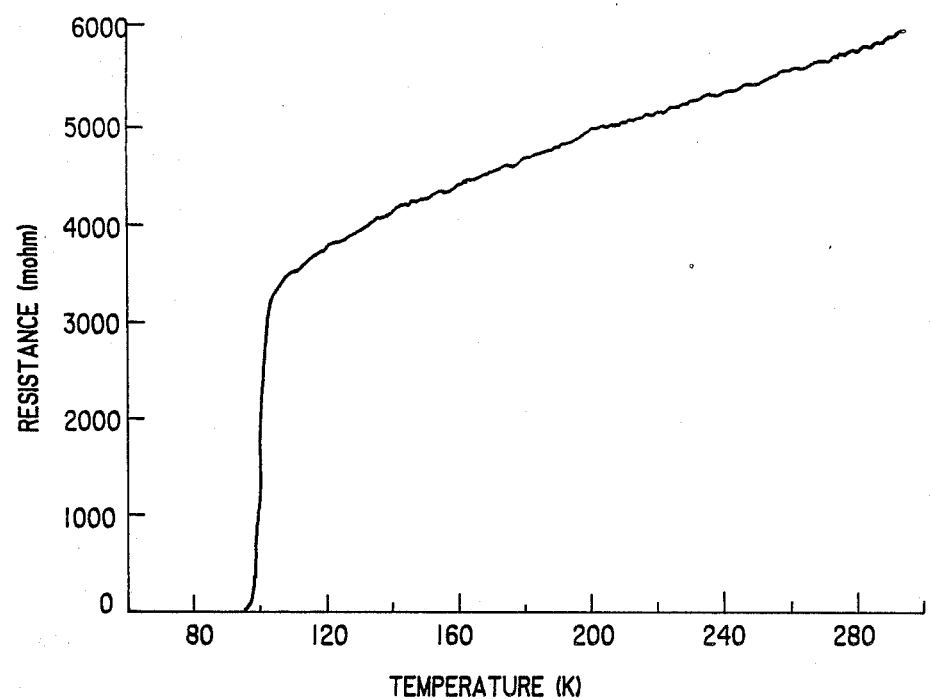
FIG. 1 is a diagram of the electrical resistance of the annealed 123 film as a function of temperature.
Figure 2:
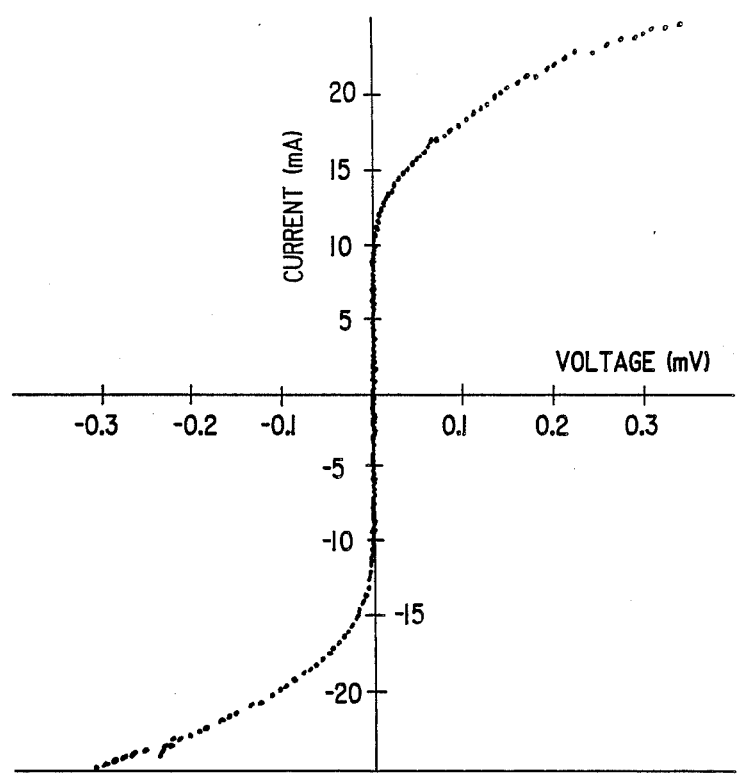
FIG. 2 is an electrical diagram of the current-voltage (I-V) characteristics of the annealed 123 film.

The initially sputtered film was insulating and had a thickness of 1 micron. It become superconductive after it was annealed in an oxygen environment at 900° C. for 30 minutes and furnace cooled. The electrical resistance of the annealed film has a function of temperature as shown in FIG. 1. The superconducting transition is near 93° K. and is very sharp. The current-voltage characteristics (I-V) are shown in FIG. 2. The estimated critical current density is approximately 350 A/cm$^2$. The advantage obtained by using the 211 phase as a substrate is that the $T_c$ of the annealed film does not degrade when compared with bulk target material and it is relatively easy to prepare.

Obviously, numerous modifications to the present invention such as using more sophisticated powder sintering techniques to improve the quality of the substrate material and the use of a compact substrate or a single crystal 211 phase substrate in order to obtain better quality films are possible in light of the above teaching. It is therefore to be understood that within the scope of the appended claims, the invention may be practiced otherwise then as specifically described herein.

What is claimed as new and desired to be secured by Letters Patent of the United States.

1. A superconducting cuprate oxide thin film on a substrate prepared by the steps of:

forming a target material by mixing together appropriate amounts of metal oxide in order to form a superconducting phase of a cuprate oxide;

annealing said target material in oxygen;

forming a substrate material by mixing together appropriate amounts of metal oxides to form at least one semiconducting phase of said superconducting cuprate oxide superconductor;

sputtering said target material to form a film on said substrate material; and annealing said film and substrate in an oxygen environment.

2. The film according to claim 1, wherein said cuprate oxide superconductor is Y-Ba-Cu-O and wherein said semiconductor phase is the green $Y_2BaCuO_5$ phase and said superconducting phase is $Y_1Ba_2Cu_3O_7$.

3. The film according to claim 2, wherein said semiconductor phase was prepared by heating and regrinding appropriate amounts of the oxides to insure complete reaction.

* * * * *